United States Patent
Lee et al.

(10) Patent No.: US 8,926,714 B2
(45) Date of Patent: Jan. 6, 2015

(54) HEAT DISSIPATING SUBSTRATE AND METHOD OF MANUFACTURING THE SAME

(71) Applicant: Samsung Electro-Mechanics Co., Ltd., Gyunggi-do (KR)

(72) Inventors: Sang Youp Lee, Seoul (KR); Joung Gul Ryu, Seoul (KR); Dong Sun Kim, Gyunggi-do (KR); Jae Hoon Choi, Gyunggi-do (KR); In Ho Seo, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/185,546

(22) Filed: Feb. 20, 2014

(65) Prior Publication Data
US 2014/0165346 A1 Jun. 19, 2014

Related U.S. Application Data

(62) Division of application No. 12/717,855, filed on Mar. 4, 2010, now Pat. No. 8,704,100.

(30) Foreign Application Priority Data

Nov. 16, 2009 (KR) .......................... 10-2009-0110480

(51) Int. Cl.
| | |
|---|---|
| *H05K 3/40* | (2006.01) |
| *H01G 9/00* | (2006.01) |
| *C25D 5/02* | (2006.01) |
| *C25D 5/12* | (2006.01) |
| *C25D 5/48* | (2006.01) |
| *H05K 3/46* | (2006.01) |

(52) U.S. Cl.
CPC ............... *H05K 3/4007* (2013.01); *C25D 5/02* (2013.01); *C25D 5/12* (2013.01); *C25D 5/48* (2013.01); *H05K 3/4608* (2013.01); *H05K 3/4652* (2013.01); *H05K 3/4069* (2013.01); *H05K 3/4647* (2013.01); *H05K 2201/0338* (2013.01); *H05K 2203/0361* (2013.01)
USPC .......................................... 29/25.03; 29/17.3

(58) Field of Classification Search
None
See application file for complete search history.

(56) References Cited

U.S. PATENT DOCUMENTS

| | | | |
|---|---|---|---|
| 4,943,468 A | 7/1990 | Gordon et al. | |
| 5,232,548 A | 8/1993 | Ehrenberg et al. | |
| 8,704,100 B2 * | 4/2014 | Lee et al. ...................... | 174/252 |
| 2009/0026604 A1 | 1/2009 | Shin et al. | |

* cited by examiner

*Primary Examiner* — Seahvosh Nikmanesh
(74) *Attorney, Agent, or Firm* — Bracewell & Giuliani LLP; Brad Y. Chin (57) ABSTRACT

Embodiments of the invention provide a heat dissipating substrate, including: a heat dissipating circuit layer formed of an electrolytic invar layer including an invar layer and electrolytic copper plating layers formed on both sides of the invar layer; insulation layers formed on both sides of the heat dissipating circuit layer such that the heat dissipating circuit layer is interposed between the insulation layers; first and second circuit layers formed on the insulation layers; and a first bump connecting the heat dissipating circuit layer with the first circuit layer and a second bump connecting the heat dissipating circuit layer with the second circuit layer. The heat dissipating substrate exhibits excellent heat dissipation efficiency and can be made thin.

4 Claims, 6 Drawing Sheets

FIG.1

Prior art

FIG.2

Prior art

FIG.3

Prior art

FIG.4

Prior art

FIG.5

Prior art

HEAT DISSIPATING SUBSTRATE AND METHOD OF MANUFACTURING THE SAME

RELATED APPLICATION

This application claims the benefit of and priority to U.S. patent application Ser. No. 12/717,855, entitled, "Heat Dissipating Substrate and Method of Manufacturing the Same," filed on Mar. 4, 2010, and issued as U.S. Pat. No. 8,704,100 B2 on Apr. 22, 2014, which claims priority under 35 U.S.C. §119 to Korean Patent Application No. KR 10-2009-0110480, entitled, "Heat Dissipating Substrate and Method of Manufacturing the Same," filed on Nov. 16, 2009, which are all hereby incorporated by reference in their entirety into this application.

BACKGROUND

1. Field of the Invention

The present invention relates to a heat dissipating substrate and a method of manufacturing the same.

2. Description of the Related Art

As electronic components have been becoming miniaturized, densified and thinned, thinned and highly-functionalized semiconductor package substrates are being required.

Particularly, in order to realize a multi-chip package (MCP) technology for stacking and mounting several semiconductor chips on one substrate or a package on package (PoP) technology for stacking several substrates mounted with a semiconductor chip, it is required to develop a substrate exhibiting a thermal expansion behavior similar to that of a semiconductor and having excellent bendability. Further, as the operation speed of a semiconductor chip increases due to advances in semiconductor chips, it is also required to solve the problem of heat generation.

In order to meet the above requirements, technologies for manufacturing a metal core substrate by inserting metal into a core are being used. The reason for this is that metal serves to block the thermal expansion behavior of a substrate and promote heat dissipation because it has very excellent thermal expansion characteristics and high thermal conductivity.

FIGS. 1 to 5 are sectional views showing a conventional method of manufacturing such a metal core substrate. The conventional method of manufacturing a metal core substrate is described as follows with reference to FIGS. 1 to 5.

Figure 1:
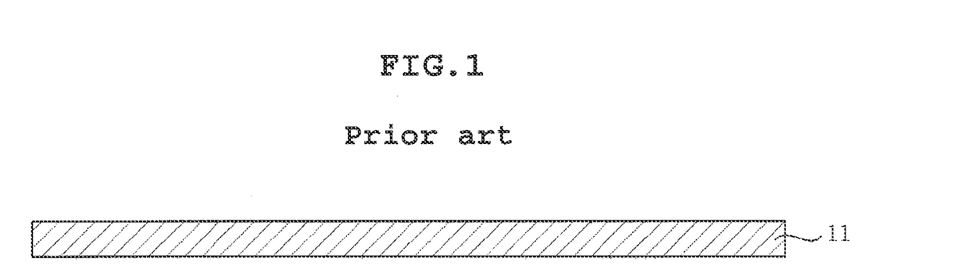
FIGS. 1 to 5 are sectional views showing a conventional method of manufacturing such a metal core substrate.

First, as shown in FIG. 1, a metal core 11 having high thermal conductivity is provided.

Figure 2:
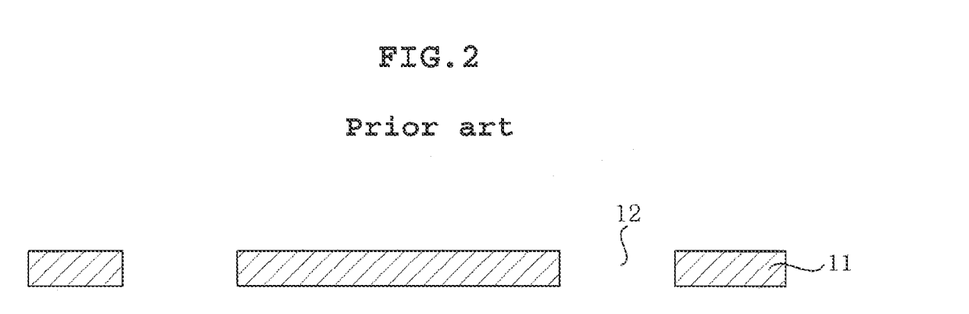

Subsequently, as shown in FIG. 2, through-holes 12 are formed in the metal core 11 by drilling work using a CNC drill or a $CO_2$/YAG laser or by etching work.

Figure 3:
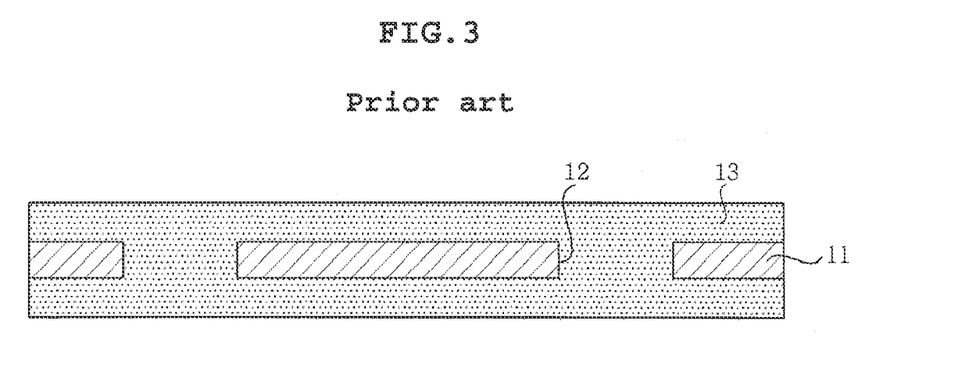

Subsequently, as shown in FIG. 3, an insulation layer 13 is formed on both sides of the metal core 11 provided with the through-holes 12.

Figure 4:
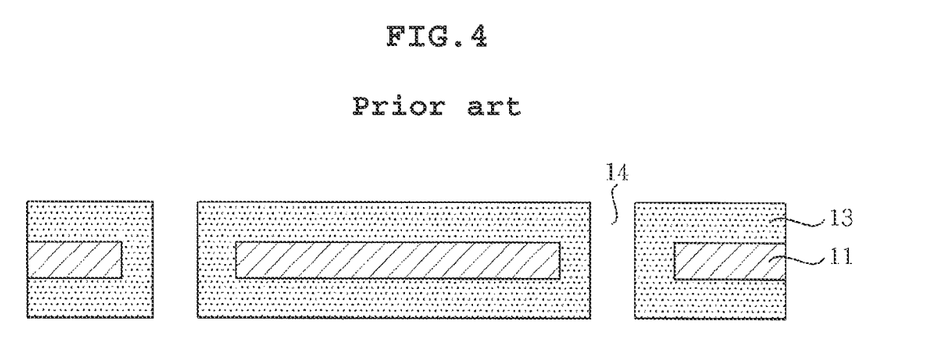

Subsequently, as shown in FIG. 4, via holes 14 for making interlayer connections are formed by machining the insulation layer 13 corresponding to the through-holes 12 formed in the metal core 11. In this case, the via holes 14 must have smaller sizes than the through-holes 12 formed in the metal core 11 in order to insulate copper plating layers formed on the inner walls of the via holes 14 from the metal core 11.

Figure 5:
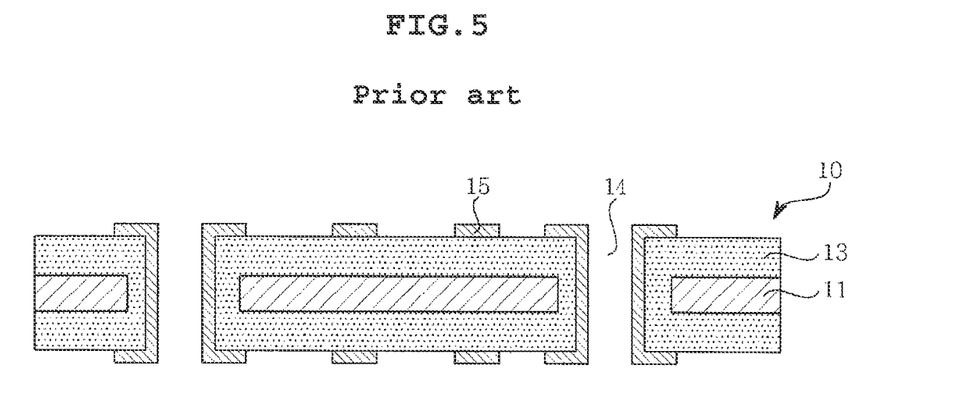

Finally, as shown in FIG. 5, copper plating layers are formed on the surface of the insulation layer 13 and the inner walls of the via holes 14 by electroless and electrolytic copper plating processes and an electrolytic plating process, and then the copper plating layers are formed into circuit layers by exposure, development and etching processes to manufacture a metal core substrate 10.

However, such a conventional method of manufacturing a metal core substrate is problematic as follows.

First, in order to prevent the electrical defect of the metal core substrate 10 due to the short of the plating layers formed on the surface of the insulation layer 13 and the inner walls of the via holes 14 formed in the metal core 11, the through-holes 12 must be formed to have a sufficient size. In this case, the residual ratio of the metal core to the substrate is at most about 50%, thus reducing thermal conductivity. Further, in order to perform drilling work such that the sizes of the via holes 14 are smaller than those of the through-holes 12, working accuracy is required, thus increasing manufacturing cost and time.

Furthermore, the metal core 11 is embedded in the insulation layer 13 in order to increase the rate of heat radiation, so that the thickness of the substrate is increased, with the result that, at the time of performing drilling work, a drill bit is easily worn compared to other substrates having the same structure, and working accuracy is also decreased.

SUMMARY

Accordingly, embodiments of the present invention have been made keeping in mind the above problems occurring in the prior art, and an object of the present invention is to provide a heat dissipating substrate which can increase heat dissipation efficiency and can be made thin, and a method of manufacturing the same.

Embodiments of the invention provide a heat dissipating substrate, including a heat dissipating circuit layer formed of an electrolytic invar layer including an invar layer and electrolytic copper plating layers formed on both sides of the invar layer; insulation layers formed on both sides of the heat dissipating circuit layer such that the heat dissipating circuit layer is interposed between the insulation layers; first and second circuit layers formed on the insulation layers; and a first bump connecting the heat dissipating circuit layer with the first circuit layer and a second bump connecting the heat dissipating circuit layer with the second circuit layer.

In accordance with an embodiment of the invention, the heat dissipating layer further includes a first outer insulation layer and a first outer circuit layer formed on one side of the insulation layer including the first circuit layer formed thereon; and a second outer insulation layer and a second outer circuit layer formed on one side of the insulation layer including the second circuit layer formed thereon.

Embodiments of the present invention further provide a method of manufacturing a heat dissipating substrate, including forming a first bump on one side of a first metal layer, and then forming a first insulation layer on the first metal layer such that the first bump pierces the first insulation layer; forming a metal foil, which is an electrolytic invar layer including an invar layer and electrolytic copper plating layers formed on both sides of the invar layer, on the first insulation layer such that the metal foil is brought into contact with the metal bump, and then patterning the metal foil to form a heat dissipating circuit layer; forming a second bump on the heat dissipating circuit layer, forming a second insulation layer on the heat dissipating circuit layer such that the second bump pierces the second insulation layer, and then forming a second metal layer on the second insulation layer such that the second metal layer is brought into contact with the second bump; and forming plating layers on the first metal layer and the second metal layer, and then patterning the plating layers to form a first circuit layer and a second circuit layer.

In accordance with an embodiment of the invention, each of the first metal layer and the second metal layer has a structure in which electrolytic copper plating layers are formed on both sides of an invar layer.

In accordance with an embodiment of the invention, the method of manufacturing the heat dissipating substrate further includes, between the forming of the second metal layer and the forming of the first and second circuit layers, removing the invar layers of the first metal layer and the second metal layer and the electrolytic copper plating layers formed on the invar layers and exposed to the outside.

In accordance with an embodiment of the invention, the method of manufacturing the heat dissipating substrate further includes, after the forming of the first and second circuit layers, forming a first outer insulation layer on the first insulation layer, and forming a second outer insulation layer on the second insulation layer; and forming a first outer circuit layer connected with the first circuit layer on the first outer insulation layer, and forming a second outer circuit layer connected with the second circuit layer on the second outer insulation layer.

Various objects, advantages and features of the invention will become apparent from the following description of embodiments with reference to the accompanying drawings.

BRIEF DESCRIPTION OF DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

Figure 6:
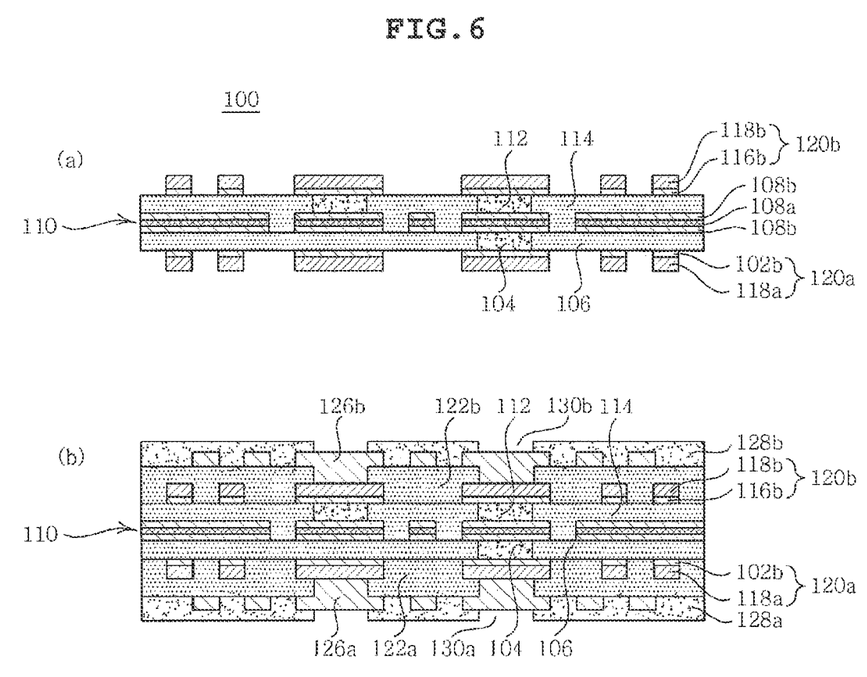
FIG. 6 shows sectional views of heat dissipating substrates, in accordance with an embodiment of the invention.

FIG. 6 shows sectional views of heat dissipating substrates, in accordance with an embodiment of the invention. For example, FIG. 6A is a sectional view of a two-layered heat dissipating substrate, and FIG. 6B is a sectional view of a four-layered heat dissipating substrate. Hereinafter, a heat dissipating substrate 100 according to an embodiment of the present invention will be described with reference to FIG. 6.

As shown in FIG. 6A, the two-layered heat dissipation substrate 100 according to this embodiment has a structure including a heat dissipating circuit layer 110 composed of an electrolytic invar layer including an invar layer 108a and electrolytic copper plating layers 108b formed on both sides of the invar layer 108a; insulation layers 106 and 114 covering the heat dissipating circuit layer 110; first and second circuit layers 120a and 120b respectively connected with the insulation layers 106 and 114 through first and second bumps 104 and 112.

In accordance with an embodiment, the heat dissipating circuit layer 110 is formed of an electrolytic invar layer, having a low thermal expansion coefficient, including an invar layer 108a and electrolytic copper plating layers 108b formed on both sides of the invar layer 108a such that it has high thermal conductivity to increase heat dissipation efficiency and can perform an buffering action to prevent the heat dissipating substrate 100 from warping by the discordance of thermal expansion coefficients between the heat dissipating circuit layer 110 and the semiconductor chips connected with the first and second circuit layers 120a and 120b. In this case, since the thickness of the invar layer 108a and/or the electrolytic copper plating layers 108b can be controlled, it is possible to realize a heat dissipating substrate which is thinner than conventional metal core substrates.

The insulation layers 106 and 114 include a first insulation layer 106 formed on one side of the heat dissipating circuit layer 110 and a second insulation layer 114 formed in the space thereof and on the other side thereof.

In accordance with an embodiment, the circuit layers 120a and 120b include a first circuit layer 120a formed on the first insulation layer 106 and a second circuit layer 120b formed on the second insulation layer 114. Here, the first circuit layer 120a includes a first metal layer 102 and a first plating layer 118a, and the second circuit layer 120b includes a second metal layer 116 and a second plating layer 118b. In a manufacturing process, when an electrolytic copper plating layer, which is a part of an electrolytic invar layer, is employed as the first metal layer 102, the first plating layer 118a is also formed of an electrolytic copper plating layer, so that the first circuit layer 120a has a structure including two electrolytic copper plating layers. The second circuit layer 120b also has the same structure as the first circuit layer 120a. Meanwhile, such a circuit layer structure is an example of circuit layer structures formed by a modified semi-additive process, and circuit layer structures formed by other well-known circuit layer forming processes can also be included in the scope of the present invention.

Further, the heat dissipating substrate 100 according to this embodiment may further include solder resist layers which protect the circuit layers 120a and 120b and which have openings for exposing pads brought into contact with connecting terminals, such as solder balls, of the circuit layers 120a and 120b.

Meanwhile, FIG. 6B shows a four-layered heat dissipating substrate. That is, the four-layered heat dissipating substrate may have a four-layered structure in which buildup layers including outer insulation layers 122a and 122b and outer circuit layers 126a and 126b are formed on both sides of the heat dissipating substrate shown in FIG. 6A and solder resist layers 128a and 128b for protecting the outer circuit layers 126a and 126b are formed on the buildup layers. In this case, the solder resist layers 128a and 128b are provided with openings 130a and 130b for exposing pads of the outer circuit layers 126a and 126b.

FIGS. 7 to 17 are sectional views showing a method of manufacturing a heat dissipating substrate, in accordance with an embodiment of the invention. Hereinafter, the method of manufacturing a heat dissipating substrate according to this embodiment will be described with reference to FIGS. 7 to 17.

Figure 7:
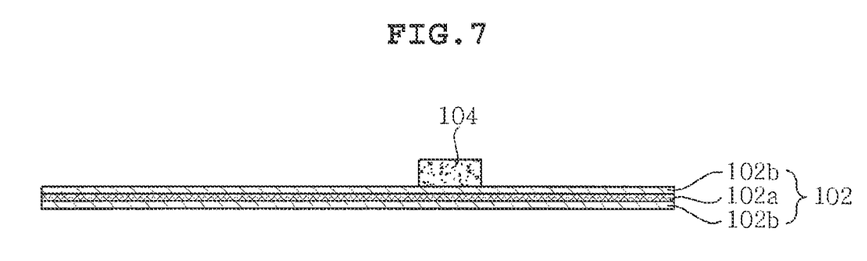
FIGS. 7 to 17 are sectional views showing a method of manufacturing a heat dissipation substrate, in accordance with an embodiment of the invention.

First, as shown in FIG. 7, a first bump 104 is formed on one side of a first metal layer 102.

In this case, the first metal layer 102, which serves to support the first bump 104 and functions as a seed layer for electrolytic copper plating when performing an electrolytic copper plating process in order to form a first circuit layer 120a, may be made of a material having predetermined strength and conductivity. For example, the first metal layer 102 may be an electrolytic invar layer including an invar layer 102a made of invar having high thermal conductivity and a low thermal expansion coefficient and electrolytic copper plating layers 102b formed on both sides of the invar layer 102a. Further, the first metal layer 102 may be surface-roughened using buffing, plasma or ion beam machining, oxide treatment, Czochralski (Cz) treatment or the like in order to increase the adhesion between the first metal layer 102 and the first bump 104 or a first insulation layer 106.

Meanwhile, the first bump 104 is formed using a screen printing method of transferring conductive paste using a mask having an opening. That is, the first bump 104 is formed on the first metal layer 102 by applying conductive paste onto a mask and then extruding the conductive paste through an opening of the mask using a squeegee. Here, the conductive paste used to form the first bump 104 may be made of a conductive material, such as Ag, Pd, Pt, Ni or Ag/Pd.

Figure 8:
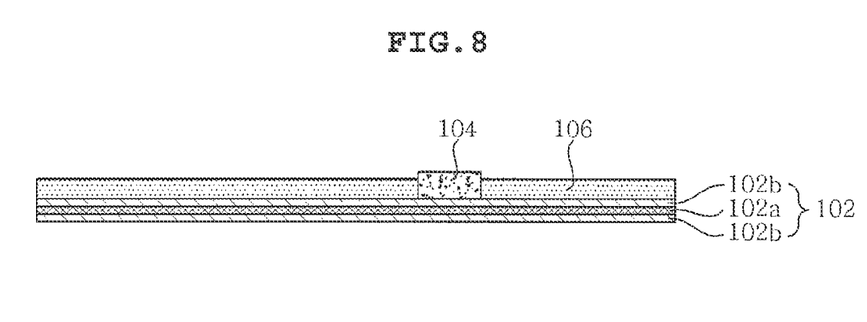

Subsequently, as shown in FIG. 8, a first insulation layer 106 is formed on the first metal layer 102 such that the first bump 104 pierces the first insulation layer 106.

In this case, the thickness of the first insulation layer 106 may be smaller than the height of the first bump 104. For example, the first insulation layer 106 may be formed such that the first bump 104 is exposed over the first insulation layer 106 by about 10~50 μm. Further, in order to increase heat dissipation efficiency, the first insulation layer 106 may have a structure in which an inorganic filler having excellent thermal conductivity, such as alumina ($Al_2O_3$), aluminum nitride (AlN) or boron nitride (BN), is dispersed in an insulating resin. Furthermore, in order to improve the flexural characteristics of a heat dissipating substrate, the first insulation layer 106 may be formed of prepreg including woven glass fiber.

Meanwhile, the first insulation layer 106 may be formed by a contact method or a noncontact method. In the contact method, the first insulation layer 106 is formed by piercing the prepreg with the first bump 104, and in the noncontact method, the first insulation layer 106 is formed by coating the first metal layer 102 with insulating resin powder using an ink-jet printing method. In this case, the noncontact method is advantageous in that the change in shape of the first bump 144 occurring when the first bump 104 pierces the first insulation layer 106 using the contact method or the gap between the first bump 104 and the first insulation layer 106 can be minimized.

Figure 9:
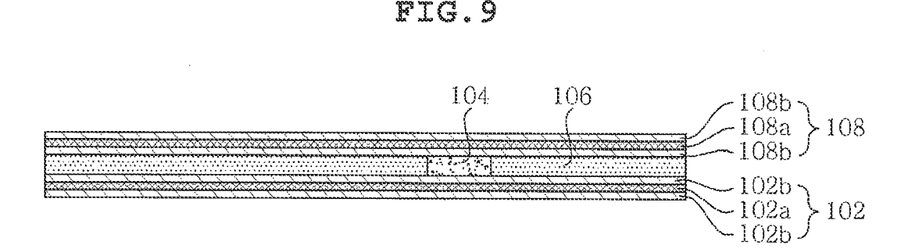

Subsequently, as shown in FIG. 9, a metal foil 108 is thrilled on the first insulation layer 106 such that the metal foil 108 is brought into contact with the metal bump 104. Here, the metal foil 108 may be an electrolytic invar layer including an invar layer 108a and electrolytic copper plating layers 108b formed on both sides of the invar layer 108a. When the metal foil 108 having such a structure is employed, the thickness of the electrolytic copper plating layers 108b can be easily controlled, it is possible to realize a heat dissipating substrate thinner than conventional metal core substrates.

In this case, the metal foil 108 may be formed on the first insulation layer 106 by pressing it using a press plate, such as a flat stainless plate or the like, while heating the first insulation layer 106 to a softening temperature or higher in vacuum.

Figure 10:
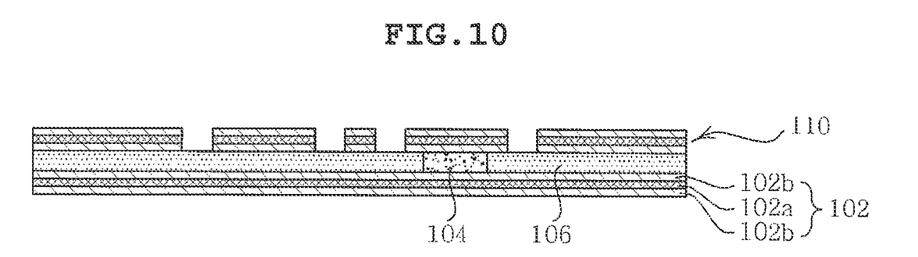

Subsequently, as shown in FIG. 10, the metal foil 108 is patterned to form a heat dissipating circuit layer. In this case, the heat dissipating circuit layer 110, differently from the conventional metal core (see 11 of FIG. 1) embedded in the insulation layer 13 to perform only a heat dissipation function, performs not only the heat dissipation function but also a function of a ground or signal line.

Figure 11:
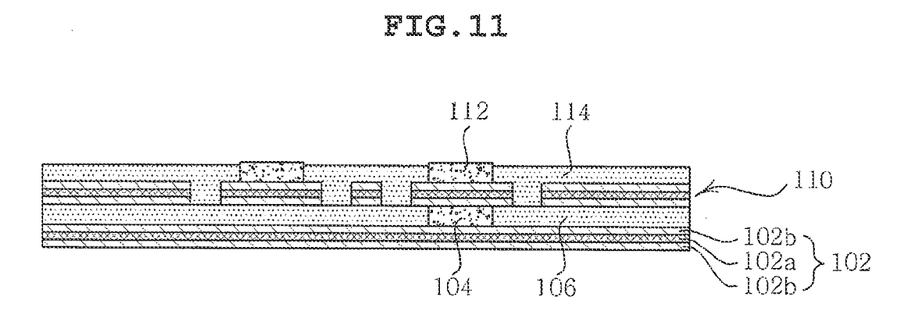

Subsequently, as shown in FIG. 11, a second bump 112 is formed on the heat dissipating circuit layer 110, and then a second insulation layer 114 is formed on the heat dissipating circuit layer 110 such that the second bump 112 pierces the second insulation layer 114. Here, the second bump 112 is formed using the same method as used in the formation of the first bump 104, and the second insulation layer 114 is formed using the same method as used in the formation of the first insulation layer 106, so a redundant description thereof will be omitted.

Figure 12:
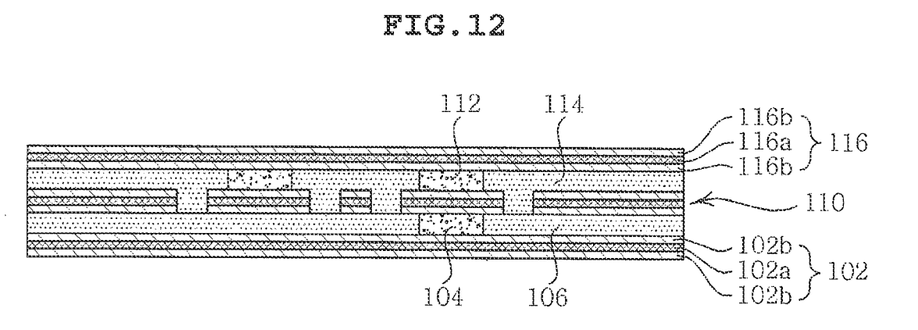

Subsequently, as shown in FIG. 12, a second metal layer 116 is formed on the second insulation layer 114 such that the second metal layer 116 is brought into contact with the second bump 112.

In this case, the second metal layer 116 may be an electrolytic invar layer including an invar layer 116a and electrolytic copper plating layers 116b formed on both sides of the invar layer 116a. Meanwhile, the second metal layer 116 may be formed on the second insulation layer 114 by pressing it using a press plate, such as a flat stainless plate or the like, while heating the second insulation layer 114 to a softening temperature or higher in vacuum.

Figure 13:
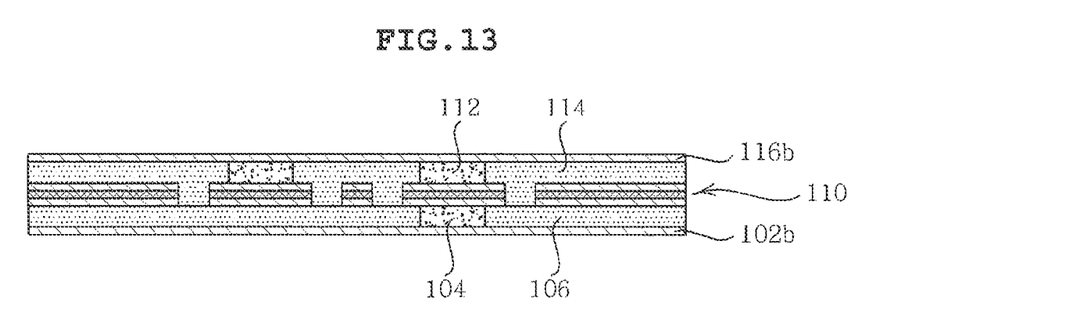

Subsequently, as shown in FIG. 13, a process of decreasing the thicknesses of the first metal layer 102 and the second metal layer 116 is performed. Here, since the first metal layer 102 and the second metal layer 116 partially constitute a first circuit layer 120a and a second circuit layer 120b, respectively, it is possible to realize a microcircuit by increasing the thicknesses thereof. For example, when the first metal layer 102 includes an invar layer 102a and electrolytic copper plating layers 102b formed on both sides of the invar layer 102a and the second metal layer 116 includes an invar layer 116a and electrolytic copper plating layers 126b formed on both sides of the invar layer 116a, the thicknesses of the first metal layer 102 and the second metal layer 116 can be decreased by removing the electrolytic copper plating layer 102b formed on one side of the invar layer 102a and the electrolytic copper plating layer 116b formed on one side of the invar layer 116a using etching. Meanwhile, when thin copper foil layers are used as the first metal layer 102 and the second metal layer 116, this process may be omitted.

Figure 14:
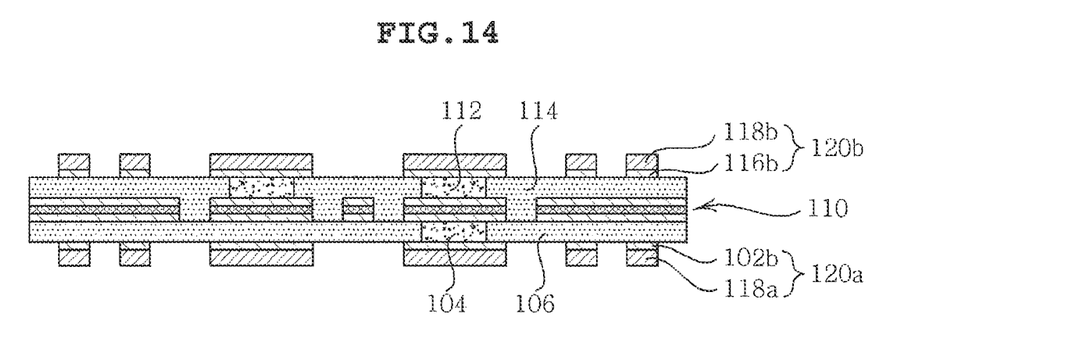

Subsequently, as shown in FIG. 14, the first metal layer 102 and the second metal layer 116 are electrolytic-plated to form a first plating layer 118a on the first metal layer 102 and to form a second plating layer 118b on the second metal layer 116, and then the first metal layer 102 and the first plating layer 118a are patterned to form a first circuit layer 120a, and the second metal layer 116 and the second plating layer 118b are patterned to form a second circuit layer 120b. In this case, since the first plating layer 118a and the second plating layer 118b are respectively formed on the first metal layer 102 and the second metal layer 116 which function as seed layers, only an electrolytic copper plating process is performed without performing an additional electroless plating process. Meanwhile, when the electrolytic copper plating layer 102b, which is a part of an electrolytic invar layer, is used as the first metal layer 102, the first circuit layer 120a includes two electrolytic copper plating layers because it is composed of the electrolytic copper plating layer 102b and the first plating layer 118a which is an electrolytic copper plating layer. Further, when the electrolytic copper plating layer 116b, which is a part of an electrolytic invar layer, is used as the second metal layer 116, the second circuit layer 120b also includes two electrolytic copper plating layers because it is composed of the electrolytic copper plating layer 116b and the first plating layer 118b which is an electrolytic copper plating layer.

Meanwhile, in order to realize a microcircuit, a semi-additive process (SAP), in which both the first metal layer 102 and the second metal layer 116 are removed by etching, the first insulation layer 106 and the second insulation layer 114 are surface-treated by desmearing, seed layers are formed on the surface-treated insulation layers 106 and 114 by chemical copper plating or sputtering, and then circuit layers are formed by electroless copper plating, can be used, and is included in the scope of the present invention.

Meanwhile, although FIG. 14 shows a two-layered heat dissipating substrate, a multi-layered heat dissipating substrate can be manufactured using this two-layered heat dissipating substrate. Hereinafter, a method of manufacturing a multi-layered (for example, four-layered) heat dissipating substrate will be described with reference to FIGS. 15 to 18.

Figure 15:
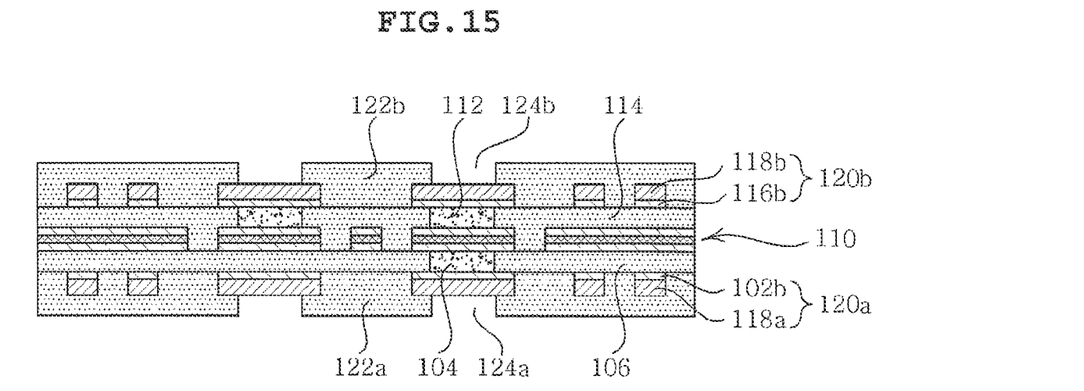

As shown in FIG. 15, a first outer insulation layer 122a is formed on the first insulation layer 106 including the first circuit layer 120a formed thereon, and a second outer insulation layer 122b is formed on the second insulation layer 114 including the second circuit layer 120b formed thereon, and then first and second via holes 124a and 124b for making interlayer connections are formed in the first and second outer insulation layers 122a and 122b, respectively.

Figure 16:
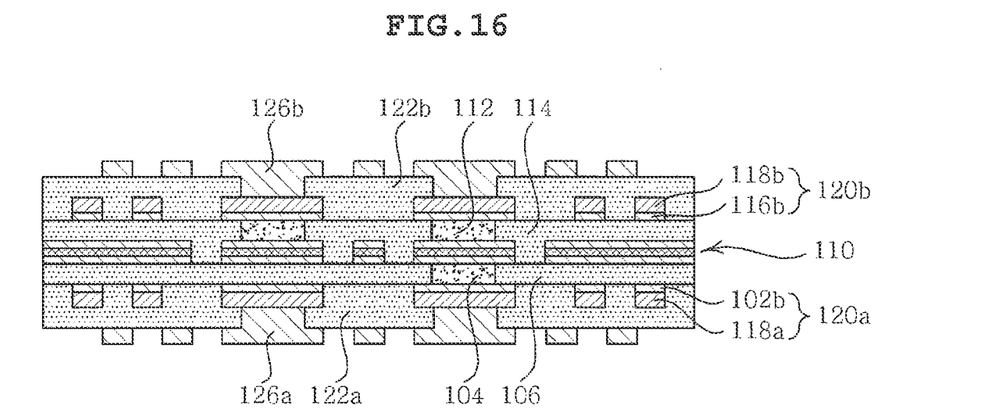

Subsequently, as shown in FIG. 16, a plating process is performed on the first and second outer insulation layers 122a and 122b and in the first and second via holes 124a and 124b to form plating layers, and then the plating layers are patterned to form first and second outer circuit layers 126a and 126b including vias.

Figure 17:
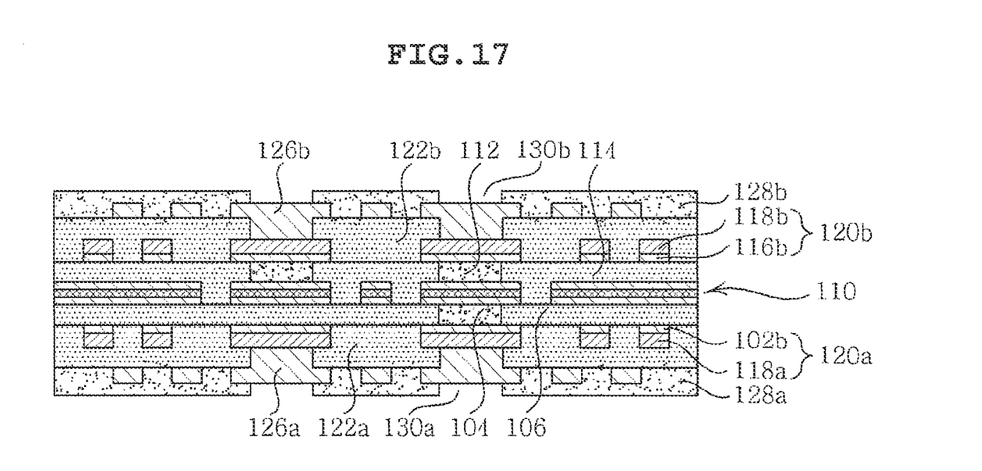

Finally, as shown in FIG. 17, first and second solder resist layers 128a and 128b are formed on the first and second outer insulation layers 122a and 122b including the first and second outer circuit layers 126a and 126b formed thereon, and then first and second openings 130a and 130b for exposing pads of the first and second outer circuit layers 126a and 126b are formed in the first and second solder resist layers 128a and 128b to manufacture a four-layered heat dissipating substrate. In this case, the pads may be provided with bumps allowing the pads to be easily connected with semiconductor chips by printing solder paste thereon. Here, the solder paste may be made of lead-tin solder or lead-free solder (SAC305).

Meanwhile, it will be obvious that a heat dissipating substrate of more than four layers also can be manufactured using the above method.

As described above, according to the heat dissipating substrate of the present invention, since a heat dissipating circuit layer, which is formed of an electrolytic invar layer including an invar layer having high thermal conductivity and low thermal expansion coefficient and electrolytic copper plating layers formed on both sides of the invar layer, is used instead of a metal core, the heat dissipating substrate not only can exhibit excellent heat dissipation performance but also can minimize its bendability attributable to the difference of thermal expansion coefficient.

Further, according to the present invention, the thicknesses of the electrolytic plating layers of an electrolytic invar layer are controlled, so that the thickness of the entire substrate can also be decreased, thereby increasing the accuracy with which holes are formed and enabling a substrate to be thin.

Embodiments of the present invention may suitably comprise, consist or consist essentially of the elements disclosed and may be practiced in the absence of an element not disclosed. For example, it can be recognized by those skilled in the art that certain steps can be combined into a single step.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

As used herein, terms such as "first" and "second" are arbitrarily assigned and are merely intended to differentiate between two or more components of an apparatus. It is to be understood that the words "first" and "second" serve no other purpose and are not part of the name or description of the component, nor do they necessarily define a relative location or position of the component. Furthermore, it is to be understood that the mere use of the term "first" and "second" does not require that there be any "third" component, although that possibility is contemplated under the scope of the embodiments of the present invention.

The singular forms "a," "an," "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

Ranges may be expressed herein as from about one particular value, and/or to about another particular value. When such a range is expressed, it is to be understood that another embodiment is from the one particular value and/or to the other particular value, along with all combinations within said range.

Although the present invention has been described in detail, it should be understood that various changes, substitutions, and alterations can be made hereupon without departing from the principle and scope of the invention. Accordingly, the scope of the present invention should be determined by the following claims and their appropriate legal equivalents.

What is claimed is:

1. A method of manufacturing a heat dissipating substrate, comprising:
    forming a first bump on one side of a first metal layer, and then forming a first insulation layer on the first metal layer such that the first bump pierces the first insulation layer;
    forming a metal foil, which is an electrolytic invar layer including an invar layer and electrolytic copper plating layers formed on both sides of the invar layer, on the first insulation layer such that the metal foil is brought into contact with the metal bump, and then patterning the metal foil to form a heat dissipating circuit layer;
    forming a second bump on the heat dissipating circuit layer, forming a second insulation layer on the heat dissipating circuit layer such that the second bump pierces the second insulation layer, and then forming a second metal layer on the second insulation layer such that the second metal layer is brought into contact with the second bump; and
    forming plating layers on the first metal layer and the second metal layer, and then patterning the plating layers to form a first circuit layer and a second circuit layer.

2. The method of manufacturing a heat dissipating substrate according to claim 1, wherein each of the first metal layer and the second metal layer has a structure in which electrolytic copper plating layers are formed on both sides of an invar layer.

3. The method of manufacturing a heat dissipating substrate according to claim 1, further comprising, between the forming of the second metal layer and the forming of the first and second circuit layers, removing the invar layers of the first metal layer and the second metal layer and the electrolytic copper plating layers formed on the invar layers and exposed to the outside.

4. The method of manufacturing a heat dissipating substrate according to claim 1, further comprising, after the forming of the first and second circuit layers:
- forming a first outer insulation layer on the first insulation layer, and forming a second outer insulation layer on the second insulation layer; and
- forming a first outer circuit layer connected with the first circuit layer on the first outer insulation layer, and forming a second outer circuit layer connected with the second circuit layer on the second outer insulation layer.

* * * * *